United States Patent [19]

Vasudev et al.

[11] Patent Number: 5,472,811
[45] Date of Patent: Dec. 5, 1995

[54] PHASE SHIFTING MASK STRUCTURE WITH MULTILAYER OPTICAL COATING FOR IMPROVED TRANSMISSION

[75] Inventors: Prahalad K. Vasudev; Kah K. Low, both of Austin, Tex.

[73] Assignees: Sematech, Inc., Austin, Tex.; Motorola Inc., Schaumburg, Ill.

[21] Appl. No.: 236,870

[22] Filed: Apr. 29, 1994

Related U.S. Application Data

[63] Continuation of Ser. No. 7,639, Jan. 21, 1993, abandoned.
[51] Int. Cl.$^6$ .................................................. G03F 9/00
[52] U.S. Cl. .................... 430/5; 430/311; 430/312; 430/323; 430/224; 428/156
[58] Field of Search ............ 430/4, 5, 22, 269, 430/311, 312, 322, 323, 321, 324, 396, 322; 428/156

[56] References Cited

U.S. PATENT DOCUMENTS

| | | | |
|---|---|---|---|
| 3,604,778 | 9/1971 | Burckhardt | 350/3.5 |
| 4,013,338 | 3/1977 | Sato et al. | 350/3.5 |
| 4,037,918 | 7/1977 | Kato | 350/3.5 |
| 4,068,018 | 1/1978 | Hashimoto et al. | 427/38 |
| 4,119,483 | 10/1978 | Hubsch et al. | 156/655 |
| 4,174,219 | 11/1979 | Andres et al. | 430/321 |
| 4,248,948 | 2/1981 | Matsuda | 430/5 |
| 4,360,586 | 11/1982 | Flanders et al. | 430/321 |
| 4,374,911 | 2/1983 | Hartley | 430/5 |
| 4,377,627 | 3/1983 | Vinton | 430/22 |
| 4,402,600 | 9/1983 | Araihara | 355/125 |
| 4,411,972 | 10/1983 | Narken et al. | 430/5 |
| 4,414,317 | 11/1983 | Culp et al. | 430/4 |
| 4,434,224 | 2/1984 | Yoshikawa et al. | 430/323 |
| 4,440,840 | 4/1984 | Yamaguchi | 430/4 |
| 4,529,686 | 7/1985 | Kraus | 430/314 |
| 4,686,162 | 8/1987 | Stangl et al. | 430/5 |
| 4,806,442 | 2/1989 | Shirasaki et al. | 430/4 |
| 4,806,454 | 2/1989 | Yoshida et al. | 430/321 |
| 4,842,969 | 6/1989 | Kawatsuki et al. | 430/5 |
| 4,852,973 | 8/1989 | Durnin et al. | 350/162 |

(List continued on next page.)

FOREIGN PATENT DOCUMENTS

| | | |
|---|---|---|
| 0395425 | 10/1990 | European Pat. Off. . |
| 0475694 | 3/1992 | European Pat. Off. . |
| 126361 | 7/1977 | Germany . |
| 61-292643 | 12/1986 | Japan . |
| 62-67514 | 3/1987 | Japan . |
| 62-50811 | 10/1987 | Japan . |
| 62-59296 | 12/1987 | Japan . |
| 63-80258 | 4/1988 | Japan . |
| 1-147458 | 6/1989 | Japan . |
| 2-78216 | 3/1990 | Japan . |
| 2-140743 | 5/1990 | Japan . |
| 3-252659 | 11/1991 | Japan . |

OTHER PUBLICATIONS

Patent Abstracts of Japan, vol. 17, No. 257, (E–1368) May 20, 1993, & JP,A,05 003 146 (Hitachi Ltd) 8 Jan. 1993.
IBM Technical Disclosure Bulletin, vol. 29, No. 3, Aug. 1986, N.Y., US, p. 1328, 'Method to Produce Sizes in Openings in Photo Images Smaller than Lithographic Minimum Size'.
Patent Abstracts of Japan, vol. 16, No. 382, (P–14382) Aug. 14, 1992 & JP,A,04 123 060 (Fujitsu Ltd) 23 Apr. 1992 see abstract.
IBM Technical Disclosure Bulletin, vol. 25, No. 12, May 1983, N.Y. US, pp. 6408–6414, 'Optical Recording Disc System and Memory Medium,' p. 6408.

(List continued on next page.)

*Primary Examiner*—S. Rosasco
*Attorney, Agent, or Firm*—William W. Kidd

[57] ABSTRACT

A multi-layer PSM structure with multi-layer optical coating disposed between a quartz substrate and a surrounding medium, which typically is air. The multi-layer coating is comprised of a high index of refraction material overlying the quartz and a lower index of refraction material overlying the first. The multi-layer coating essentially functions as an anti-reflective coating to reduce scattering and reflection at the interface boundaries.

14 Claims, 2 Drawing Sheets

U.S. PATENT DOCUMENTS

| | | | |
|---|---|---|---|
| 4,881,257 | 11/1989 | Nakagawa | 378/35 |
| 4,885,231 | 12/1989 | Chan | 430/321 |
| 4,890,309 | 12/1989 | Smith et al. | 378/35 |
| 4,902,899 | 2/1990 | Lin et al. | 250/492 |
| 4,935,334 | 6/1990 | Boettiger et al. | 430/322 |
| 4,939,052 | 7/1990 | Nakagawa | 430/5 |
| 4,997,747 | 3/1991 | Yoshida et al. | 430/321 |
| 5,024,726 | 6/1991 | Fujiwara | 156/653 |
| 5,045,417 | 9/1991 | Okamoto | 430/5 |
| 5,079,113 | 1/1992 | Ohta et al. | 430/5 |
| 5,153,083 | 10/1992 | Garofalo et al. | 430/5 |
| 5,194,344 | 3/1993 | Cathey, Jr. et al. | 430/5 |
| 5,208,125 | 5/1993 | Lowrey et al. | 430/5 |
| 5,217,830 | 6/1993 | Lowrey | 430/5 |
| 5,219,686 | 6/1993 | Kamon | 430/5 |
| 5,225,035 | 7/1993 | Rolfson | 156/643 |
| 5,229,230 | 7/1993 | Kamon | 430/5 |

OTHER PUBLICATIONS

International Conference on Microlithography, Rome, Italy, 17–19 Sep. 1991, 79–85 ISSN 0167–9317, pp. 79–86, Lin BJ 'The optimum numerical aperture for attenuated phase–shifting masks'.

"Four More Significant Japanese Advances in Phase Shifting Technology," Semiconductor International, Dec. 1991, p. 16.

"Improved resolution of an i–line stepper using a phase–shifting mask," Tsuneo Terasawa et al., J. Vac. Sci. Technol. B 8(6) Nov./Dec. 1990, pp. 1300–1308.

"Fabrication of 64M Dram with i–Line Phase–Shift Lithography," K. Nakagawa et al., IEEE, Apr. 1990, pp. 817–820.

"Conjugate Twin–Shifter for the New Phase Shift Method to High Resolution Lithography," H. Ohtsuka et al., SPIE, vol. 1463, Optical/Laser Microlithography IV (1991), pp. 112–123.

"Exploration of Fabrication Techniques for Phase–Shifting Masks", A. K. Pfau et al., SPIE, vol. 1463, Optical/Laser Microlithography IV (1991), pp. 124–134.

"Transparent phase shifting mask with multistage phase shifter and comb–shaped shifter," Hisashi Watanabe et al., SPIE, vol. 1463, Optical/Laser Microlithography IV (1991), pp. 101–110.

"Phase–Shifting Mask and FLEX method for Advanced Photo–lithography," Hiroshi Fukuda et al., SPIE, vol. 1264, Optical/Laser Microlithography III (1990), pp. 14–25.

"The Phase–Shifting Mask II: Imaging Simulations & Submicrometer Resist Exposures," Marc D. Levenson et al., IEEE, vol. ED–31, No. 6, Jun. 1984, pp. 753–763.

"New phase–shifting mask with highly transparent $SiO_2$ phase shifters," Isamu Hanyu et al., SPIE vol. 1264 Optical/Laser Microlithography III (1990), pp. 167–177.

"Transparent Phase Shifting Mask," H. Watanabe et al., IEEE, Apr. 1990, pp. 821–824.

"A 5.9$\mu m^2$ Super Low Power SRAM Cell Using a New Phase–Shift Lithography," T. Yamanaka et al., IEEE, Apr. 1990, pp. 477–480.

"Phase Shift Masking Traced to 1976 Patent", Semiconductor International, Jun. 1993, pp. 32–34.

"Improving Resolution in Photolithography with a Phase–Shifting Mask", Marc D. Levenson et al., IEEE Transaction on Electron Devices, vol. ED–29, No. 12, Dec. 1982, pp. 1828–1836.

"0.2$\mu m$ or Less I–Line Lithography By Phase–Shifting–Mask Technology", Hideyuki Jinbo and Yoshio Yamashita, Semiconductor Technology Lab, Oki Electric Industry Co., Japan, IEDM 90 (1990) pp. 825–828.

"Sub–Half–Micron i–Line Lithography by Use of LMR–UV Resist", Hideyki Jinbo et al., Japanese Journal of Applied Physics, vol. 28, No. 10, Oct., 1989, pp. 2053–2057.

"Subhalf–micron patterning of negative working resist by using new phase–shifting masks", Hideyki Jinbo et al., Journal of Vacuum Science & Technology B, Second Series, vol. 8, No. 6, Nov./Dec. 1990, pp. 1745–1748.

"0.3$\mu$–micron optical lithography using a phase–shifting mask", Tsuneo Terasawa et al., SPIE, vol. 1088 Optical/Laser Microlithography II (1989), pp. 25–32.

"What IS a Phase–Shifting Mask?", Marc D. Levenson, SPIE, vol. 1496, 10th Annual Symposium on Microlithography (1990), pp. 20–26.

"Phase–Shifting and Other Challenges in Optical Mask Technology", Burn J. Lin, SPIE, vol. 1496, 10th Annual Sumposium on Microlithography (1990) pp. 54–79.

"Modeling Phase Shifting Masks", Andrew R. Neureuther, SPIE, vol. 1496, 10th Symposium on Microlithography (1990), pp. 80–88.

"New Phase Shifting Mask with Self–aligned Phase Shifters for a Quarter Micron Photolithography," IEEE, A. Nitayama et al., IEDM Proceedings, IEDM–89, pp. 57–60, Jul. 1989.

"The Optimum Numerical Aperature for Optical Projection Microlithography" B. J. Lin et al., SPIE Proceedings, vol. 1463, pp. 42–53, 1991.

"The optimum numerical aperature for attenuated phase–shifting masks," B. J. Lin, Microelectronic Engineering 17 (1992) pp. 79–86.

"A critical examination of submicron optical lithography using simulated project images," Alan E. Rosenbluth et al., J. Vac. Sci. Technol. B1(4) Oct.–Dec. 1983, pp. 1190–1195.

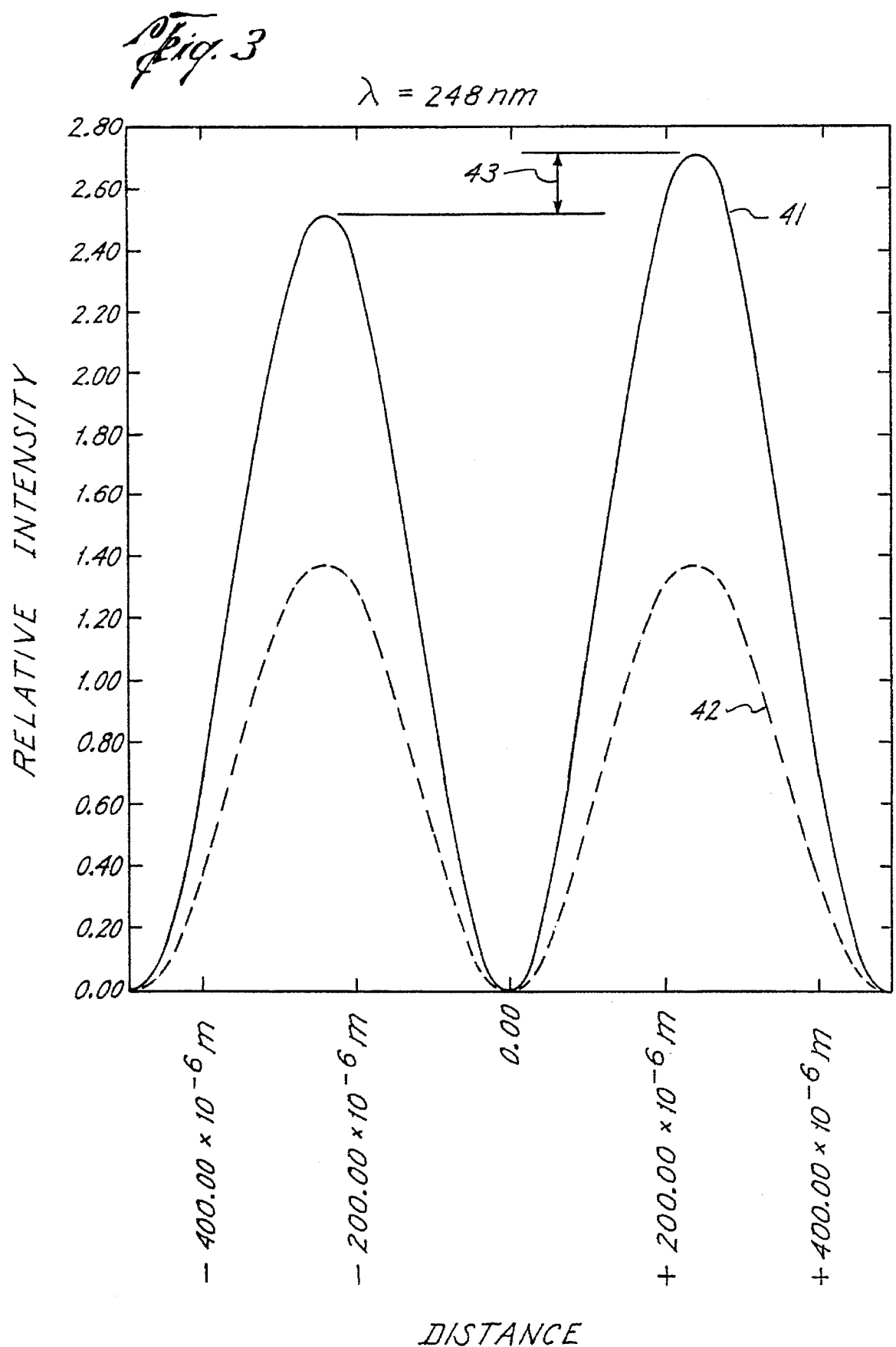

PHASE SHIFTING MASK STRUCTURE WITH MULTILAYER OPTICAL COATING FOR IMPROVED TRANSMISSION

This application is a continuation of application Ser. No. 08/007,639, filed Jan. 21, 1993, now abandoned.

BACKGROUND OF THE INVENTION

1. Field of the Invention

The present invention relates to the field of fabricating photomasks for use in the manufacture of semiconductor devices and, more particularly, to the fabrication of phase shifting photomasks having improved transmission characteristics for use in sub-micron lithography techniques.

2. Related Applications

This application is related to co-pending application entitled, "Phase Shifting Mask Structure with Absorbing/Attenuating Sidewalls for Improved Imaging", Ser. No. 007,638, filed Jan. 21, 1993; and copending application entitled, "Method of Fabricating Phase Shifters with Absorbing/Attenuating Sidewalls Using An Additive Process", Ser. No. 007,640, filed Jan. 21, 1993.

3. Prior Art

Various techniques are known in the prior art for manufacturing devices on a semiconductor wafer, such as a silicon wafer. Typically, lithography processes are utilized to overlay a pattern(s) onto the wafer. Each pattern provides for selected portions of the wafer to undergo a particular lithographic process, such as deposition, etch, implant, etc. Photomasks (masks) are generally utilized to overlay a particular pattern on the wafer or a layer formed on the wafer. Generally a number of these masks are required for manufacturing a complete device on the wafer.

The earlier prior art lithography techniques rely upon optical techniques in which light is passed through a mask to overlay a pattern on the wafer. Generally, a pattern on the mask equated to a pattern design appearing on the surface of the wafer. However, as the semiconductor technology evolved to allow ever smaller device structures to be fabricated on a wafer, it became increasingly difficult to continue to use the standard optical techniques. It is generally theorized that as device features approach submicron dimensions of 0.25 microns and below, alternative techniques would be required to project patterns onto a wafer.

Due to the limitation imposed by the wavelength of light, resolution at the edges of these patterns tend to degrade when ordinary optical techniques are employed. Standard optical techniques utilizing ultra violet (UV) light will extend the lower range, but still fall short of desired resolution at extremely low ranges (under 0.25 microns). It was generally believed that technologies employing shorter wavelength would ultimately be required for lithography. A number of approaches have been suggested with x-ray lithography being viewed as the technology for use at these low submicron ranges.

However, recent experimentation in the area of phase shifting masks (PSMs) have shown that the PSM technology can be employed to extend the range of optical techniques currently being utilized. That is, the current I-line (at a wavelength of 356 nanometers) and deep ultra violet, or DUV (at a wavelength of 248 nanometers), optical photolithography techniques can be used with the phase shifting photomasks to provide the requisite resolution with sufficient depth of focus for fabricating semiconductor devices having dimensions in the order of 0.25 microns and below. It is believed that resolutions in the order of 0.1 micron resolution levels can be obtained with sufficient focus latitude by the use of ordinary lithography techniques when phase shifting techniques are applied.

It is generally understood that the technique for improving resolution in photolithography by the use of phase-shifting masks was first proposed by Levenson et al., ("Improving Resolution in Photolithography with a Phase-Shifting Mask", IEEE Transactions on Electron Devices, Vol. ED-29, No. 12, December 1992, pp. 1828–1836) and later implemented by Terasawa et al. ("0.3-micron optical lithography using a phase-shifting mask", Proceedings of SPIE, Vol. 1088 Optical/Laser Microlithography II, 1989, pp. 25–32.

The conventional PSM comprises of creating phase shifting regions in the transparent areas of a photomask. These phase-shifting regions are formed either by depositing transparent films of appropriate thickness and then patterning them over the desired transparent areas using a second level lithography and etch technique or by etching vertical trenches into the quartz substrate.

The etched depth or shifter film thickness is designed to produce the desired 180 degree phase shift at the proper incident wavelength (for example, I-line or DUV). In both cases, the interface between the quartz and the surrounding medium (typically air), as well as the edges or walls between the phase shifted and unshifted regions, usually occurs as a sharp transition between high and low refractive index regions. This sharp transition in index from quartz to air causes significant reflections and "scattering" of light in undesired directions and this effect causes an overall loss in transmitted intensity through the mask. In addition, the unequal light intensities from the phase shifted and unshifted regions cause variations in pattern dimensional control (such as to critical dimensions or minimum features), due to an undesired aerial image from the mask.

Furthermore, in addition to the edge effects, the index mismatch between quartz and air causes backward reflections into the mask substrate over the entire area, leading to an overall loss in transmission intensity to the target and a loss in overall intensity and contrast.

It is appreciated that an improved PSM that addresses the edge scattering of light, as well as the backward reflections, would improve image and exposure characteristics.

SUMMARY OF THE INVENTION

A PSM structure with a specially designed multilayer optical coatings for providing improved light transmission is described. On a PSM having a quartz-air interface, scattering and backward reflection are encountered at the interface (including "edges") degrading the resolution and ultimately impacting the aerial image which is to be projected.

A multilayer coating is disposed between the quartz substrate and the surrounding medium, which typically is air. A first layer adjacent to the quartz has a high index of refraction (higher than quartz) while a second layer atop the first layer has a lower index of refraction (lower than the index of refraction of the first layer). This multi-layer coating essentially operates as a form of anti-reflection coating, wherein scattering and reflection are reduced at the edges and front surfaces, thereby improving the overall forward transmission.

and also showing a number of rays which exemplify transmission of light.

Figure 2:
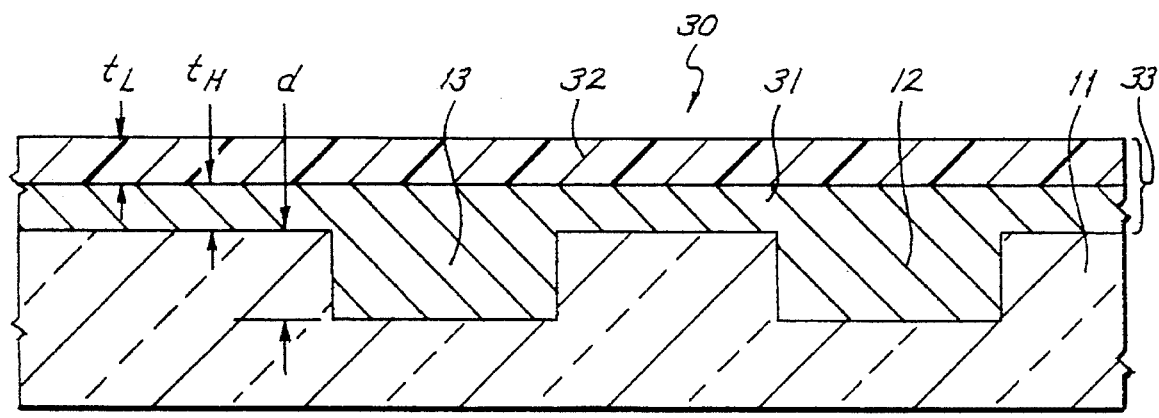

FIG. 2 is a cross-sectional diagram of a PSM of the present invention in which a high refraction of index layer is overlaid over a quartz substrate, including shifter regions, and a subsequent lower refraction of index layer is formed in order to provide a multi-layer optical coating.

Figure 1:
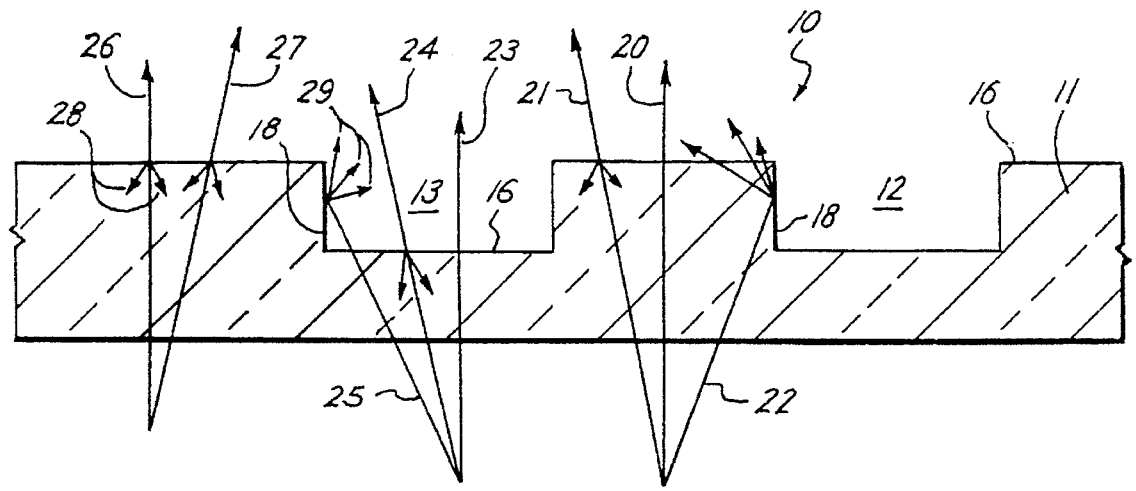
FIG. 1 is a cross-sectional diagram of a prior art unattenuated PSM having a quartz substrate and trench "shifters"

FIG. 3 is a graphic illustration comparing light intensity profiles for the PSMs shown in FIGS. 1 and 2.

DETAILED DESCRIPTION OF THE PREFERRED EMBODIMENTS

A technique for providing phase shifting masks (PSMs) with multilayer optical coatings is described. In the following description, numerous specific details are set forth, such as specific structures, layers, materials, etc., in order to provide a thorough understanding of the present invention. However, it will be obvious to one skilled in the art that the present invention may be practiced without these specific details. In other instances, well-known processes and structures have not been described in detail in order not to unnecessarily obscure the present invention.

Referring to FIG. 1, a prior art unattenuated PSM 10 is illustrated having two phase shifting regions 12 and 13 formed within substrate 11. The substrate 11 is typically made from glass or quartz and openings (commonly referred to as trenches) 12 and 13 which form the phase shifter are etched into substrate 11. Thus, light rays traversing the full length of the substrate, as depicted by ray 20 is in phase, while light rays, such as ray 23 traversing through the shifter 13 is phase shifted, typically 180 degrees.

In order to achieve complete transmission of the aerial image, it is preferred that light is not scattered as it passes through mask 10. However, it is inevitable that some scattering will occur due to the transitioning of the light ray from one material to another. For example, in the prior art PSM 10 of FIG. 1, quartz 11 will typically have an index of refraction of 1.5 while the surrounding air has an index of refraction of 1.0. Thus, it is more than likely that not all of the light, depicted as rays 20-27 in FIG. 1, will transition across the change in the medium, which is defined as an "edge". A good portion of the total light will transition the front surface (horizontal) edge region 16 without scattering, as is shown by rays 20 and 23. Light which strike the edge 16 at an oblique angle will typically experience scattering. This is illustrated by rays 21, 24 and 27. Even rays normal to the edge 16 can experience scattering, as is shown by the scattering occurring at the edge 16 for ray 26. However, this type of scattering 28 at the edge 16 reflects backward into the medium and does not transition across the edge 16. Hence it is referred to as backward reflection. Furthermore, rays such as 22 and 25, which transition to the sidewalls (vertical edge) 18 of the shifter region experience considerably more scattering 29.

Additionally, it should be noted that the scattering can occur with one, nth order some or all of the diffraction components. For example, rays 23-25 can be from a single point source in which ray 23 is the zero order diffraction component, while rays 24 and 25 are the first and second order diffraction components, respectively. Thus, it is possible that an aerial image can lose resolution simply by having one of the diffraction order components experience the scattering due to the edge effect.

In order to reduce the edge scattering and backward reflection problems encountered with the prior art PSM 10, the PSM of the present invention provides for a unique solution to reduce or inhibit the scattering arising at the quartz/air interface.

Referring to FIG. 2, a PSM 30 of the present invention is shown. Quartz substrate 11, having the phase shifter regions 12 and 13 is formed by one of known prior art techniques. The preferred embodiment provides for a formation of a specially designed multilayer optical coating 33, tailored to a specific wavelength and illumination system, overlying the substrate 11, including the open region which forms the phase shifters 12 and 13. The multilayer optical coating 33 is comprised of a first layer 31 and second layer 32. It is to be noted that layer 31 completely fills in the shifter regions 12 and 13, as well as completely covering the quartz 11 at the unshifted regions.

The multilayer optical coating 33 essentially provides two film layers 31 and 32 with alternating high and low indices of refraction. Material comprising the first layer 31 has a higher refractive index than that of substrate 11 and also of the material comprising second layer 32. For example, layer 31 would have a refractive index of 2.0 or greater, while layer 32 would have a refractive index of 1.5 or less. Therefore, a light ray transitioning through PSM 30 will normally experience a transition through four different materials, hence three interfaces. The transition sequence will be quartz (n=1.5)/high refractive index material (n> 2.0)/low refractive index material (n<1.5)/air (n=1.0).

The quartz/high refractive index/low refractive index/air multilayer configuration functions as an anti-reflection coating suppressing the backward reflections encountered at the air quartz interface in the prior art PSM 10 of FIG. 1. This phenomenon is similar to the multilayer lens coating utilized on optical lenses to reduce scattering, but with different physical mechanism for photomasks.

A variety of materials which can satisfy the desired optical index requirement can be readily deposited utilizing conventional techniques, such as sputtering and physical vapor deposition (PVD). First, the first layer 31 is deposited onto substrate 11 overlying both the shifted and unshifted regions. Typically, a planarization technique is required to planarize the upper surface of first layer 31. Planarization techniques are known in the prior art. It is desired that the higher index film 31 is deposited conformally to fill the entire trench region, which form the phase shifter regions 12 and 13, so that it can cover both the sidewalls and the horizontal areas of the phase shifted regions. Then it is planarized. This material also forms the phase shifting medium at the appropriate wavelength. Subsequently, a lower index thin-film 32 is deposited onto the planarized surface of the first layer 31 by conventional deposition techniques such as spin coating. It is to be further noted that sputtering or evaporation techniques can also be readily adapted for use with metallic film.

The materials to be utilized for the formation of the layers 31 and 32 will be dependent on the particular wavelength of the incident light. The thickness $t_H$ and $t_L$ of each of the high-low index films 31–32 should be $m\lambda/4$, where $\lambda$ is the wavelength of the incident light and m is an integer corresponding to multiples of the quarter wave structure. Furthermore, materials can be chosen to have optical properties which simultaneously satisfy the two equations below. Defining the refractive indices and thickness of the films 31 and 32 as $n_H$, $t_H$, $n_L$, $t_L$, respectively, the design criteria is:

$$n_H t_H + n_L t_L = n_{eff} t_{eff}, \quad \text{(Equation 1)}$$

where $t_{eff} = \lambda/2(n_{eff}-1)$  (Equation 2)

The two equations are solved numerically to obtain a range of values for $n_{eff}$ and $t_{eff}$. Appropriate values are chosen based on the performance and ease of fabrication.

It is to be noted that the shifter depth d can be minimized due to the high index fill since the optical path length for phase shifting is unchanged. That is, a particular shifter depth d is required for a glass index of 1.5. For higher index material d can be decreased, which decrease in d aids in the planarization process. The combined high index/low index multilayer film 33 is adjusted in thickness according to equation 2 to provide total phase shift of 180 degrees between the phase shifted and unshifted areas. A variety of materials can be used for both films 31 and 32. For example, magnesium fluoride ($MgF_2$), titanium dioxide ($TiO_2$), zinc oxide (ZnO), and aluminum oxide, ($Al_2O_3$), can be readily used for the higher index layer 31 while organic films, such as polyvinylfluoride, forms of silicon oxide (SiOx), and magnesium oxide (MgO) can be readily used for the lower index materials. It is to be appreciated that other materials with the aforementioned optical parameters can be readily used and the invention is not restricted to the materials suggested above.

Referring to FIG. 3, a graphic illustration comparing the light intensity between shifted and unshifted areas of the prior art PSM 10 and the PSM 30 of the present invention is shown. On the abscissa, distance left of the origin depicts the phase shifted region (i.e., shifter 13), while the unshifted region is depicted to the right of the origin. The ordinate provides the amplitude of relative light intensity.

Two conditions are shown in the graph of FIG. 3. Curve 41 shows the intensity profile of the aerial image projected onto the target, such as a semiconductor wafer, form the prior art PSM 10, while curve 42 shows equivalent intensity profile but with the use of two thin film layers 31 and 32. Without the multilayer coating 33, the prior art PSM 10 results in the difference 43 of maximum intensity. However, with the PSM 30 of the present invention, shifted and unshifted profiles are substantially equal. This results in improved resolution (less distortion) and improved depth of focus. The two amplitudes can be readily increased equivalently by increasing the intensity of the light source or, alternatively, kept at the lower relative intensity but increased the exposure time. It is to be noted that because the shifter trenches are also filled with the high index material, scattering at the vertical sidewalls of the shifter region is also reduced.

Thus, the PSM of the present invention reduces backward reflections, as well as scattering at the interface between quartz and air, in order to improve the aerial image being projected.

We claim:

1. A phase shifting photomask comprising:

a mask substrate having phase shifting regions disposed thereon for phase shifting of incident light transmission therethrough, such that a phase difference occurs between light traversing through said phase shifting regions as compared to other regions of said substrate, said other regions being defined as nonshifting regions;

said phase shifting regions being formed by having a difference in thickness of said substrate between phase shifting and nonshifting regions, said difference in thickness being a result of trenches with vertical sidewalls formed in said substrate;

a first layer overlying said substrate and completely covering said phase shifting and nonshifting regions, including said trenches and said sidewalls, such that portions of said first layer overlying phase shifting regions of said substrate are of a different thickness than portions overlying nonshifting regions of said substrate;

said first layer having an index of refraction greater than that of said substrate;

a second layer overlying said first layer and having an index of refraction lesser than that of said first layer, but greater than that of a surrounding medium;

wherein light transmission through combined thicknesses of said first and second layers overlying said substrate at phase shifting regions as compared to light transmission through combined thicknesses of said first and second layers overlying said substrate at nonshifting regions provides for said phase shifting; and wherein a sequence of indices of refraction provided by said substrate, first layer, second layer and surrounding medium functions to suppress backward reflections and scattering of transmitted light normally encountered at an interface of said substrate and said surrounding medium, in order to provide relatively equal light intensities to be transmitted through said phase shifting and nonshifting regions of said photomask to improve image resolution and depth of focus.

2. The phase shifting photomask of claim 1 wherein said first layer is formed from a material selected from a group consisting of metallic oxides.

3. The phase shifting photomask of claim 2 wherein said second layer is formed from a material selected from a group consisting of organic films.

4. The phase shifting photomask of claim 3 wherein said second layer is formed from a material selected from a group consisting of organic films.

5. An improved phase shifting photomask having a multilayer optical coating comprising:

a mask substrate having vertical trenches with vertical sidewalls formed thereon for providing 180° phase difference in the transmission of incident light through said substrate at trenched versus non trenched regions;

a first layer overlying said substrate and completely filling in said vertical trenches and sidewalls, such that portions of said first layer overlying trenched regions of said substrate are of a different thickness than portions overlying nontrenched regions;

said first layer having an index of refraction greater than that of said substrate;

a second layer overlying said first layer and having an index of refraction lesser than that of said first layer, but greater than that of a surrounding medium;

wherein light transmission through combined thicknesses of said first and second layers overlying said substrate at trenched regions as compared to light transmission through combined thicknesses of said first and second layers overlying said substrate at nontrenched regions provides for said phase difference of 180° when exiting said photomask; and wherein a sequence of indices of refraction provided by said substrate, first layer, second layer and surrounding medium functions to suppress backward reflections and scattering of transmitted light normally encountered at an interface of said substrate and said surrounding medium, in order to provide relatively equal light intensities to be transmitted through phase shifting and nonshifting regions of said photomask to improve image resolution and depth of focus.

6. The phase shifting photomask of claim 5 wherein said first layer is formed from a material selected from a group consisting of metallic oxides.

7. The phase shifting photomask of claim 5 wherein said substrate is of quartz;

said first layer is formed from a material selected from a group consisting of magnesium fluoride, titanium dioxide, zinc oxide, aluminum oxide; and said second layer is formed from a group consisting of organic films.

8. The phase shifting photomask of claim 7 wherein said first layer has a refractive index of greater than 2.0 and said second layer has a refractive index of less than 1.5.

9. A method of fabricating a photomask having a multilayer optical coating disposed on a mask substrate comprising the steps of:

providing a mask substrate having vertical trenches with vertical sidewalls formed thereon wherein a difference in thickness of said substrate at trenched versus nontrenched regions provides for phase difference in the transmission of light through said substrate;

depositing a first layer overlying said substrate and completely filling in said trenches and sidewalls, such that portions of said first layer overlying trenched regions of said substrate are of a different thickness than portions overlying nontrenched regions, said first layer having an index of refraction greater than that of said substrate;

planarizing upper surface of said first layer;

depositing a second layer overlying said planarized upper surface of said first layer and said second layer having an index of refraction lesser than that of said first layer, but greater than that of a surrounding medium;

wherein light transmission through combined thicknesses of said first and second layers overlying said substrate at trenched regions as compared to light transmission through combined thicknesses of said first and second layers overlying said substrate at nontrenched regions provides for said phase difference when exiting said mask;

wherein a sequence of indices of refraction provided by said substrate, first layer, second layer and surrounding medium functions to suppress backward reflections and scattering of transmitted light normally encountered at an interface of said substrate and said surrounding medium, in order to provide relatively equal light intensities to be transmitted through phase shifting and nonshifting regions of said mask to improve image resolution and depth of focus.

10. The method of claim 9 wherein said first layer is formed from a material selected from a group consisting of metallic oxides.

11. The method of claim 10 wherein said second layer is formed from a material selected from a group consisting of organic films.

12. The method of claim 9 wherein said substrate is of quartz;

said first layer is formed from a material selected from a group consisting of magnesium fluoride, titanium dioxide, zinc oxide, aluminum oxide; and said second layer is formed from a group consisting of organic films.

13. The method of claim 12 wherein said first layer has a refractive index of greater than 2.0 and said second layer has a refractive index of less than 1.5.

14. The method of claim 9 wherein thicknesses and materials utilized for said first and second layers overlying nonshifted regions of said substrate simultaneously satisfy equations $$n_H t_H + n_L t_L = n_{eff} t_{eff}; \text{ and}$$

$$t_{eff} = \lambda/2(n_{eff}-1)$$

where $n_H$ and $t_H$ are refractive index and thickness of said first layer, respectively; and where $n_L$ and $t_L$ are refractive index and thickness of said second layer, respectively; and wherein phase shifting is determined by depth of said vertical trenches and property of said material utilized in said first layer to fill said trenches.

* * * * *